United States Patent [19]

Sakai et al.

[11] Patent Number: 4,729,004
[45] Date of Patent: Mar. 1, 1988

[54] SEMICONDUCTOR PHOTO DEVICE

[75] Inventors: Kazuo Sakai, Tokyo; Yuichi Matsushima, Tokorozawa; Yukio Noda, Yokohama; Takaya Yamamoto, Niza, all of Japan

[73] Assignee: Kokusai Denshin Denwa Kabushiki Kaisha, Tokyo, Japan

[21] Appl. No.: 904,775

[22] Filed: Sep. 5, 1986

Related U.S. Application Data

[63] Continuation of Ser. No. 573,959, Feb. 21, 1984, abandoned, which is a continuation of Ser. No. 290,084, Aug. 4, 1981, abandoned.

[30] Foreign Application Priority Data

Aug. 18, 1980 [JP] Japan .................. 55-112672

[51] Int. Cl.[4] .................. H01L 29/90; H01L 29/161; H01L 27/14
[52] U.S. Cl. ........................ 357/30; 357/13; 357/16; 357/61
[58] Field of Search .................. 357/13, 16, 30, 61

[56] References Cited

U.S. PATENT DOCUMENTS

| | | | |
|---|---|---|---|
| 4,122,407 | 10/1978 | Van Vech Tau | 357/16 |
| 4,144,540 | 3/1979 | Bottka | 357/30 |
| 4,179,702 | 12/1979 | Lamonte | 357/30 |
| 4,473,835 | 9/1984 | Forrest et al. | 357/13 |

OTHER PUBLICATIONS

K. Taguchi et al., "InP-InGaAsP Planar Avalanche Photodiodes with Self-Guard-Ring Effect", *Electronics Letters*, vol. 15 (1979) pp. 453-455.

H. D. Law et al., "Ion-Implanted InGaAsP Avalanche Photodiode", *Applied Physics Letters*, vol. 33 (1978) pp. 920-922.

M. C. Boissy et al., "An Efficient GaInAs Photodiode for Near-Infrared Detection", Conference: Proceedings of the 6th International Symposium on Gallium Arsenide and Related Compounds, Edinburgh, Scotland (20-22 Sep. 1976) pp. 427-436.

*Primary Examiner*—J. Carroll
*Attorney, Agent, or Firm*—Emmanuel J. Lobato; Robert E. Burns

[57] ABSTRACT

A semiconductor photo detector provided with a photo detecting portion, in which at least three semiconductor layers of the same conductivity type and different energy gaps are formed in the order of magnitude of the energy gap, and in which another semiconductor layer which has the same composition as a first semiconductor layer having the largest energy gap among the at least three semiconductor layers but is different in conductivity type from the first semiconductor layer is formed in contact with the first semiconductor layer at the optical input side of the semiconductor photo diode.

6 Claims, 4 Drawing Figures

SEMICONDUCTOR PHOTO DEVICE

This is a continuation of application Ser. No. 573,959, filed Feb. 21, 1984 and now abandoned, which is a continuation of application Ser. No. 290,084, filed Aug. 4, 1981, now abandoned.

BACKGROUND OF THE INVENTION

The present invention relates to a semiconductor photo detector.

Photo detectors each having a semiconductor pn junction are widely employed for optical communications. In communications using a silica optical fiber, materials which exhibit sensitivity in a 1.0 to 1.7 μm range, where the fiber has a small transmission loss, are Ge, $In_{1-x}Ga_xAs$, $In_{1-x}Ga_xAs_yP_{1-y}$, $Ga_{1-x}Al_xSb$ and so forth. In a conventional photo detector using a p-n junction, the pn junction is formed, for example in a Ge or $In_{1-x}Ga_xAs$ layer; a reverse bias voltage is applied to the junction and light is directed to the photo detector from one side thereof, thereby to detect a photoelectrically converted current. However, the above conventional photo detector has defects, such as a low quantum efficiency and a large dark current as mentioned below.

BRIEF SUMMARY OF THE INVENTION

An object of the present invention is to provide a semi-conductor photo detector which is free from such defects of the prior art and which is provided with a hetero junction high in a quantum efficiency for photoelectric conversion and small in dark current.

In accordance with the present invention, there is provided a semiconductor photo detector having a photo detecting portion, in which at least three semiconductor layers of the same conductivity type and different energy gaps are formed in the order of magnitude of the energy gap, and in which another semiconductor layer which has the same composition as a first semiconductor layer having the largest energy gap among the at least three semiconductor layers but is different in conductivity type from the first semiconductor layer is formed in contact with the first semiconductor layer on the optical input side.

BRIEF DESCRIPTION OF THE DRAWINGS

The invention will be hereinafter described in detail in comparison with the prior art with reference to the accompanying drawings, in which.

DETAILED DESCRIPTION

Figure 1:
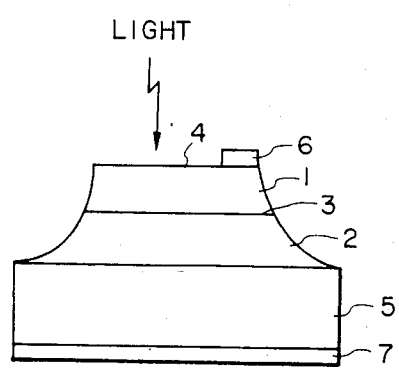
FIG. 1 is a longitudinal sectional view showing an example of a conventional photo detector.
Figure 2:
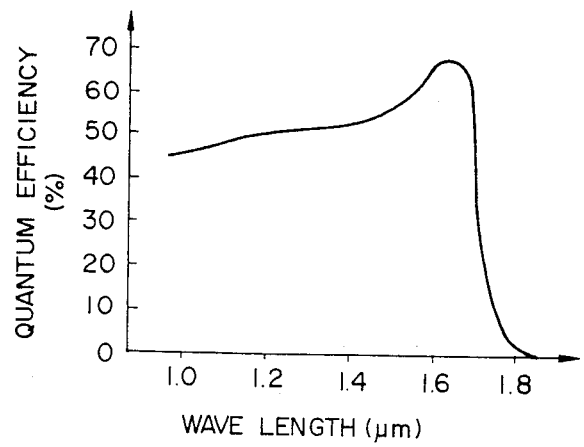
FIG. 2 is a characteristic curve showing the quantum efficiency of the example depicted in FIG. 1.

To make differences between the prior art and the present invention clear, examples of the prior art will first be described. FIG. 1 is a sectional view and shows an example of the section of a conventional photo detector using $In_{0.53}Ga_{0.47}As$. Reference numeral 1 indicates a p-type $In_{0.53}Ga_{0.47}As$ layer which serves as a light receiving layer; 2 designates an n-type $In_{0.53}Ga_{0.47}As$ layer; 3 identifies a pn junction plane; 4 denotes a light receiving surface; 5 represents an n-type InP substrate; and 6 and 7 show metal electrodes. In this case, recombination of carriers created by light is effected in the vicinity of the surface of the light receiving layer 1. This phenomenon is called surface recombination and is well known. Since this recombination depends on the wavelength of light, there occurs the wavelength dependency of the quantum efficiency. In the $In_{0.53}Ga_{0.4}As$ photo detector depicted in FIG. 1, the quantum efficiency becomes maximum in the neighborhood of a wavelength 1.65 μm and the quantum efficiency decreases with a decrease in the wavelength, as shown in FIG. 2. FIG. 2 shows an example of the wavelength dependency of the quantum efficiency, the abscissa representing the wavelength (μm) and the ordinate the quantum efficiency (%). The ratio of decrease of the quantum efficiency varies with a distance between the light receiving surface 4 and the pn junction plane 3, the carrier concentration distribution and so forth; but, in order to prevent the decrease of the quantum efficiency caused by the surface recombination, it is sufficient to form on the light receiving layer 1 a crystal of larger energy gap than that of the light receiving layer 1. Namely, it is sufficient to form a p-type InP layer by crystal growth, for example, on the p-type $In0.53Ga0.47As$ layer. However, when such an InP layer is to be directly grown on the $In_{0.53}Ga_{0.47}As$ layer by the liquid phase epitaxial technique, usually employed for the fabrication of this kind of devices, the $In_{0.53}Ga_{0.47}As$ layer is dissolved into a melt for growing the InP layer, making the crystal growth impossible. It is possible to grow, instead of the InP layer, an $In_{0.60}Ga_{0.40}As_{0.91}P_{0.09}$ layer the composition of which is close to that of the $In_{0.53}Ga_{0.47}As$ layer; in this case, however, there is a defect such that the wavelength region in which the photo detector exhibits sensitivity is narrow because of the light absorption of the $In_{0.60}Ga_{0.40}As_{0.91}P_{0.09}$ layer. Further, since the pn junction plane 3 lies in the $In_{0.53}Ga_{0.47}As$ layer of small energy gap, there is a defect of the presence of large dark current.

With reference to the accompanying drawings, the present invention will hereinafter be described in detail.

Although the following description will be mainly given of an InGaAsP semiconductor, the present invention is also applicable to other semiconductors.

Figure 3A:
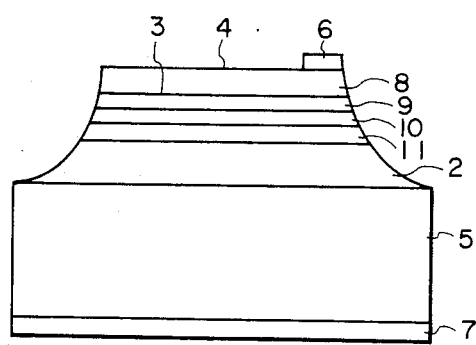
FIGS. 3A and 3B are longitudinal sectional views illustrating embodiments of the present invention.
Figure 3B:
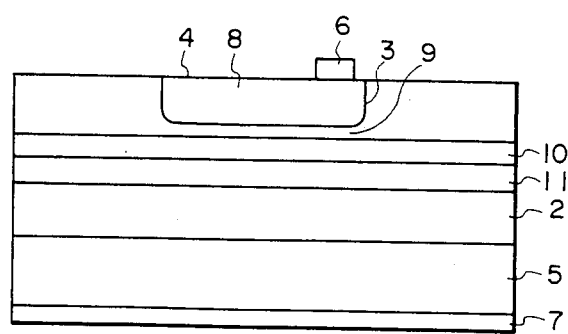

FIG. 3 illustrates examples of a photo detector using a InGaAsP semiconductor according to the present invention, FIG. 3A is a sectional view of a mesa type device and FIG. 3B a sectional view of a planar type device. Reference numeral 8 indicates a p-type InP layer; 9 designates an n-type InP layer; 10 identifies an n-type $In_{0.74}Ga_{0.26}As_{0.60}P_{0.40}$ layer; 11 denotes an n-type $In_{0.60}Ga_{0.40}As_{0.91}P_{0.09}$ layer; 2 represents an n-type $In_{0.53}Ga_{0.47}As$ layer; 3 shows a pn junction plane; 4 refers to a light receiving surface; 5 indicates an n-type InP substrate; and 6 and 7 designate metal electrodes. The thicknesses of the respective layers under the light receiving surface 4 are such, for example, as follows: The layer 8 is about 2 μm, the layer 9 about 1 μm, the layers 10 and 11 about 0.1 μm and the layer 2 about 3 μm. By forming the layers 9 and 10 between the $In_{0.53}Ga_{0.47}As$ layer 2 and the InP layer 8, the interfaces of the respective layers can be made flat. Further, by forming the pn junction plane 3 in contact with the InP layer 8, a dark current density in the vicinity of the breakdown voltage can be decreased by two or more orders of magnitudes in comparison with the dark current density in a case where the pn junction plane 3 lies between the $In_{0.53}Ga_{0.47}As$ layers 1 and 2, as shown in FIG. 1. Moreover, by selecting the carrier concentration of the layers 9, 10, 11 and 2 to be less than $10^{16}$ cm$^{-3}$, the end of a depletion layer can be extended to the In$_{0.53}$Ga$_{0.47}$As layer 2; carriers optically excited in the layers 10, 11 and 2 can be efficiently taken out as a photo current, so that a photo detector of high quantum efficiency can be obtained.

While in the foregoing the photo detector has been described mainly in connection with the operation as a photo diode which has no amplifying function, it is also possible to operate it as an avalanche photo diode by applying a voltage up to the vicinity of the breakdown voltage and by avalanche-multiplying the optically-excited carriers. In this case, the dark current in the neighborhood of the breakdown voltage is small and a differential resistance is also small, so that the multiplication gain can be also made larger as compared with the avalanche photo diode which has a pn junction in the In$_{0.53}$Ga$_{0.47}$As layer.

In the foregoing embodiments, by inserting two InGaAsP layers of different compositions between the InP layer and the In$_{0.53}$Ga$_{0.47}$As layer to form the pn junction plane in contact with the InP layer, semiconductor photo detectors are obtained which are high in quantum efficiency over a wide wavelength range and small in dark current. The number of layers which are formed between the InP layer and the In$_{0.53}$Ga$_{0.47}$As layer need always not be two but may selected as desired, including one. Although the embodiments have been described in respect of the case of using In$_{1-x}$Ga$_x$As$_y$P$_{1-y}$ ($0.42y \leq x \leq 0.50y$ and $0 \leq y \leq 1$) the lattice constant of which is substantially equal to that of InP and the energy gap of which varies over a wide range, it is also possible to employ compound semiconductors such as Ga$_{1-x}$Al$_x$As$_y$Sb$_{1-y}$ ($0 \leq X \leq 0.5$; $0.4 \leq y \leq 0.6$), which can be epitaxially grown on InP without serious lattice mismatching. In this case, InGaAsP layers 10 and 11 in FIGS. 3A and 3B can be replaced by the above-mentioned GaAlAsSb layer without any change in conductivity type, carrier concentration, layer thickness and substrate material. Moreover, it is also possible to employ semiconductors which are reverse in conductivity type from those used in the embodiments.

What is claimed is:

1. A semiconductor photo detector provided with a photo detecting portion, electrodes and a substrate, in which at least three semiconductor layers of the same conductivity type and different energy gaps are formed in the order of magnitude of the energy gap so as to be connected to one of said electrodes through said substrate, said three semiconductor layers being a first semiconductor layer (9), a second semiconductor buffer layer (10 and 11) and a third semiconductor layer (2) employed as a main light absorbing layer, and in which a fourth semiconductor layer (8) forms a p-n junction together with the first semiconductor layer and has the same composition as the semiconductor layer having the largest energy gap among the at least three semiconductor layers but is different in conductivity type from the first semiconductor layer and is in contact with the first semiconductor layer so as to be connected to the other of said electrodes, said at least three semiconductor layers and said fourth semiconductor layer defining said photo detecting portion, said second semiconductor layer having a larger energy gap than that of said third semiconductor layer for providing graded composition between said first semiconductor layer and said third semiconductor layer, said second semiconductor layer and said third semiconductor layer defining the light absorbing region, said third semiconductor layer having the largest thickness among said three semiconductor layers, said third semiconductor layer and said light absorbing region having carrier concentrations so that the end of a depletion layer can be extended to said third semiconductor layer, and said substrate having a larger forbidden bandgap energy than said main light absorbing layer.

2. A semiconductor photo detector according to claim 1, wherein said at least three semiconductor layers comprises an n-type InP layer, an n-type In$_{0.74}$Ga$_{0.26}$As$_{0.60}$P$_{0.40}$ layer, an n-type In$_{0.60}$Ga$_{0.40}$As$_{0.91}$P$_{0.09}$ layer and an n-type In$_{0.53}$Ga$_{0.47}$As layer, and said another semiconductor layer is a p-type InP layer.

3. A semiconductor photo detector according to claim 1, wherein said at least three semiconductor layers comprises a p-type InP layer, a p-type In$_{0.74}$Ga$_{0.26}$As$_{0.60}$P$_{0.40}$ layer, a p-type In$_{0.60}$Ga$_{0.40}$As$_{0.91}$P$_{0.09}$ layer and a p-type In$_{0.53}$Ga$_{0.47}$As layer, and said another semiconductor layer is an n-type InP layer.

4. A semiconductor photo detector according to claim 1, wherein the carrier concentrations of said at least three semiconductor layers are less than $10^{16}$ cm$^{-3}$.

5. A semiconductor photo detector according to claim 1, wherein said at least three semiconductor layers comprise an n-type InP layer, an n-type In$_{1-x}$Ga$_x$As$_y$P$_{1-y}$ ($0.42y \leq x \leq 0.50y$; $0 \leq y \leq 1$) and an n-type In$_{1-x}$Ga$_x$As ($0.42 \leq x \leq 0.50$) layer.

6. A semiconductor photo detector according to claim 1, wherein said at least three semiconductor layers comprise a p-type InP layer, a p-type In$_{1-x}$Ga$_x$As$_y$P$_{1-y}$ ($0.42y \leq x \leq 0.50y$; $0 \leq y \leq 1$) layer and a p-type InGaAs layer.

* * * * *